(12) United States Patent
Mudakatte et al.

(10) Patent No.: US 9,966,426 B2
(45) Date of Patent: May 8, 2018

(54) AUGMENTED CAPACITOR STRUCTURE FOR HIGH QUALITY (Q)-FACTOR RADIO FREQUENCY (RF) APPLICATIONS

(71) Applicant: QUALCOMM Incorporated, San Diego, CA (US)

(72) Inventors: Niranjan Sunil Mudakatte, San Diego, CA (US); Daeik Daniel Kim, Del Mar, CA (US); David Francis Berdy, San Diego, CA (US); Changhan Hobie Yun, San Diego, CA (US); Je-Hsiung Jeffrey Lan, San Diego, CA (US); Chengjie Zuo, Santee, CA (US); Mario Francisco Velez, San Diego, CA (US); Robert Paul Mikulka, Oceanside, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 14/853,967

(22) Filed: Sep. 14, 2015

(65) Prior Publication Data
US 2017/0077214 A1 Mar. 16, 2017

(51) Int. Cl.
*H01L 23/057* (2006.01)
*H01L 23/48* (2006.01)
(Continued)

(52) U.S. Cl.
CPC .......... *H01L 28/60* (2013.01); *H01L 23/5223* (2013.01); *H01L 27/0805* (2013.01);
(Continued)

(58) Field of Classification Search
CPC ............. H01L 27/0676; H01L 27/0716; H01L 27/0755; H01L 27/0777; H01L 27/0788;
(Continued)

(56) References Cited

U.S. PATENT DOCUMENTS 5,963,466 A * 10/1999 Evans, Jr. ............... G11C 11/22
257/295
6,777,777 B1 8/2004 Kar-Roy et al.
(Continued)

OTHER PUBLICATIONS

International Search Report and Written Opinion—PCT/US2016/044103—ISA/EPO—Oct. 18, 2016.

*Primary Examiner* — Natalia Gondarenko
(74) *Attorney, Agent, or Firm* — Qualcomm Incorporated/Seyfarth Shaw LLP

(57) ABSTRACT

An augmented capacitor structure includes a substrate and a first capacitor plate of a first conductive layer on the substrate. The augmented capacitor structure also includes an insulator layer on a surface of the first capacitor plate facing away from the substrate and a second capacitor plate. The second capacitor plate includes a second conductive layer on the insulator layer, supported by the first capacitor plate as a first capacitor. A second capacitor electrically is coupled in series with the first capacitor. The first capacitor plate is shared by the first capacitor and the second capacitor as a shared first capacitor plate. An extended first capacitor plate includes a first dummy portion of a third conductive layer and a first dummy via bar extending along the surface of the shared first capacitor plate. The first dummy portion extends along and is supported by the first dummy via bar.

20 Claims, 10 Drawing Sheets

(51) Int. Cl.
*H01L 23/495* (2006.01)
*H01L 49/02* (2006.01)
*H01L 23/522* (2006.01)
*H01L 27/08* (2006.01)
*H01L 23/00* (2006.01)

(52) U.S. Cl.
CPC .............. *H01L 28/87* (2013.01); *H01L 28/91* (2013.01); *H01L 24/13* (2013.01); *H01L 2224/0401* (2013.01); *H01L 2224/04042* (2013.01); *H01L 2224/13109* (2013.01); *H01L 2224/94* (2013.01); *H01L 2924/1033* (2013.01); *H01L 2924/10329* (2013.01); *H01L 2924/10337* (2013.01); *H01L 2924/1305* (2013.01); *H01L 2924/1306* (2013.01); *H01L 2924/14* (2013.01)

(58) Field of Classification Search
CPC ............. H01L 27/0794; H01L 27/0805; H01L 27/0682; H01L 27/101; H01L 28/82; H01L 28/60; H01L 28/90; H01L 28/00; H01L 28/40–28/92; H01L 23/5223; H01L 28/91; H01L 28/87; H01L 2924/14; H01L 2924/1033; H01L 2924/10329; H01L 2924/1305; H01L 2924/1306; H01L 2924/10337; H01L 2224/94; H01L 2224/13109; H01L 2224/0401; H01L 2224/04042; H01L 24/13; H01L 2224/26125; H01L 2224/32058; H01L 2224/32059; H01L 2924/30105; H01L 2924/12; H01L 2924/1205; H01L 27/10808; H01L 27/10835; H01L 27/10852
USPC ....... 257/528, 533, 532, 534, 535, 758, 296, 257/310, E29.165; 438/239, 381, 240, 438/250, 3, 253
See application file for complete search history.

(56) References Cited

U.S. PATENT DOCUMENTS

| | | | |
|---|---|---|---|
| 7,202,567 B2 | 4/2007 | Kikuta et al. | |
| 7,889,509 B2 | 2/2011 | Urashima et al. | |
| 8,476,745 B2 | 7/2013 | Tu et al. | |
| 8,994,145 B2 | 3/2015 | Sato | |
| 2004/0094790 A1 | 5/2004 | Kanaya | |
| 2004/0195601 A1* | 10/2004 | Kumura | H01L 27/11507 257/295 |
| 2006/0022241 A1* | 2/2006 | Shimojo | G06K 7/0043 257/296 |
| 2007/0035984 A1* | 2/2007 | Arai | H01L 27/105 365/145 |
| 2007/0170547 A1 | 7/2007 | Chang, II et al. | |
| 2008/0087928 A1* | 4/2008 | Nagai | H01L 27/105 257/295 |

* cited by examiner

US 9,966,426 B2

AUGMENTED CAPACITOR STRUCTURE FOR HIGH QUALITY (Q)-FACTOR RADIO FREQUENCY (RF) APPLICATIONS

BACKGROUND

Field

Aspects of the present disclosure relate to semiconductor devices, and more particularly to an augmented capacitor structure for high quality (Q)-factor radio frequency (RF) applications.

Background

The process flow for semiconductor fabrication of integrated circuits (ICs) may include front-end-of-line (FEOL), middle-of-line (MOL), and back-end-of-line (BEOL) processes. The front-end-of-line process may include wafer preparation, isolation, well formation, gate patterning, spacer, extension and source/drain implantation, silicide formation, and dual stress liner formation. The middle-of-line process may include gate contact formation. Middle-of-line layers may include, but are not limited to, middle-of-line contacts, vias or other layers within close proximity to the semiconductor device transistors or other like active devices. The back-end-of-line process may include a series of wafer processing steps for interconnecting the semiconductor devices created during the front-end-of-line and middle-of-line processes. Successful fabrication of modern semiconductor chip products involves an interplay between the materials and the processes employed.

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements. Further design challenges for mobile RF transceivers include analog/RF performance considerations, including mismatch, noise and other performance considerations. The design of these mobile RF transceiver includes the use of capacitors to, for example, suppress resonance, and/or to perform filtering, bypassing and coupling. For example, surface mount technology (SMT) capacitors may reduce resonance/noise in high power, system on chip devices, such as application processors and graphics processors.

SUMMARY

An augmented capacitor structure may include a substrate and a first capacitor plate including a first conductive layer on the substrate. The augmented capacitor structure may also include an insulator layer on a surface of the first capacitor plate facing away from the substrate. The augmented capacitor structure may further include a second capacitor plate. The second capacitor plate includes a second conductive layer on the insulator layer and is supported by the first capacitor plate as a first capacitor. The augmented capacitor structure may also include a second capacitor electrically coupled in series with the first capacitor. The first capacitor plate may be shared by the first capacitor and the second capacitor as a shared first capacitor plate. The augmented capacitor structure may further include an extended first capacitor plate. The extended first capacitor plate may include a first dummy portion of a third conductive layer and a first dummy via bar extending along the surface of the shared first capacitor plate. The first dummy portion extends along and is supported by the first dummy via bar.

A method of fabricating an augmented capacitor structure may include depositing and patterning a first conductive layer on a substrate as a first capacitor plate. The method may also include depositing an insulator layer on a surface of the first capacitor plate facing away from the substrate. The method may further include depositing and patterning a second conductive layer on the insulator layer as a second capacitor plate of a first capacitor electrically coupled in series with a second capacitor. The first capacitor plate may be shared by the first capacitor and the second capacitor as a shared first capacitor plate. The method may also include depositing and patterning a third conductive layer including a first dummy portion supported by a first dummy via bar extending along the surface of the shared first capacitor plate. The first dummy portion may extend along the first dummy via bar.

An augmented capacitor structure may include a substrate and a first capacitor plate including a first conductive layer on the substrate. The augmented capacitor structure may also include an insulator layer on a surface of the first capacitor plate facing away from the substrate. The augmented capacitor structure may further include a second capacitor plate. The second capacitor plate includes a second conductive layer on the insulator layer and is supported by the first capacitor plate as a first capacitor. The augmented capacitor structure may also include a second capacitor electrically coupled in series with the first capacitor. The first capacitor plate may be shared by the first capacitor and the second capacitor as a shared first capacitor plate. The augmented capacitor structure may further include an extended first capacitor plate. The extended first capacitor plate may include a first dummy portion of a third conductive layer and a first means for extending along the surface of the shared first capacitor plate. The first dummy portion extends along and is supported by the first extending means.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
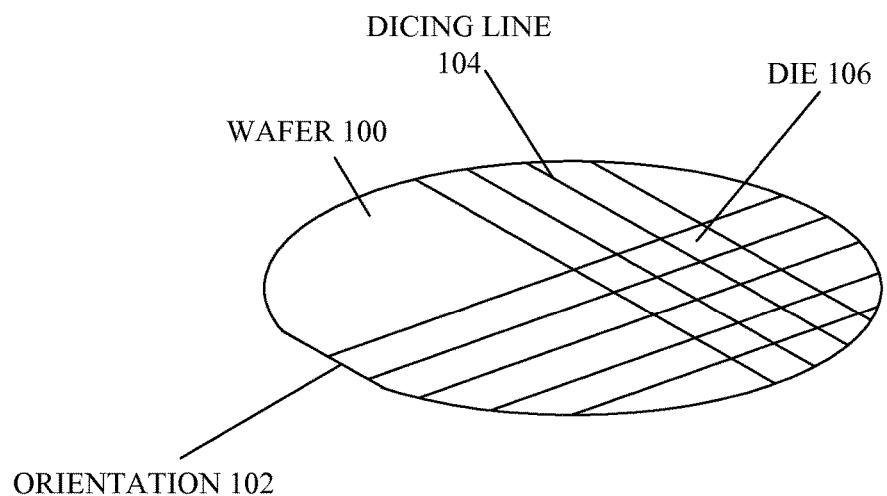
FIG. 1 illustrates a perspective view of a semiconductor wafer in an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR," and the use of the term "or" is intended to represent an "exclusive OR."

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as carrier aggregation. Further design challenges for mobile RF transceivers include analog/RF performance considerations, including mismatch, noise and other performance considerations. The design of these mobile RF transceivers includes the use of capacitors, for example, to suppress resonance, and/or to perform filtering, bypassing and coupling.

A capacitor is an example of an electrical device used to store energy (e.g., charge) in an electrical field between closely spaced capacitor plates according to a capacitance value. This capacitance value provides a measure of the amount of charge stored by the capacitor at a certain voltage. In addition to their charge storing capability, capacitors are also useful as electronic filters because they enable differentiation between high frequency and low frequency signals. For example, surface mount technology (SMT) capacitors may reduce resonance/noise in high power system on chip devices, such as application processors and graphics processors.

Another important factor in mobile RF chip design is linearity. Linearity may refer to a circuit behavior in which an output signal varies in direct proportion to an input signal. In a linear device, the output-to-input signal amplitude ratio should be the same, no matter the strength of the input signal. For example, in a metal-insulator-metal (MIM) capacitor that includes first and second plates separated by a dielectric layer, the linearity of the MIM capacitor is directly related to the dielectric thickness. Unfortunately, control of the dielectric thickness involves a process change that is expensive and physically limited. Conventionally, a thickness (e.g., 1-5 microns) of a first capacitor plate of the MIM capacitor is less than a thickness (e.g., 5-20 microns) of a second capacitor plate to ensure dielectric integrity.

Unfortunately, a surface of the first capacitor plate can become highly irregular if the thickness of the first capacitor plate grows too large. In this scenario, a breakdown voltage of the MIM capacitor is reduced, resulting in an increased variation of the dielectric integrity. In this arrangement, the first capacitor plate has a substantially greater resistance than the second capacitor plate. The increased resistance of the first capacitor plate, however, results in an RF quality (Q)-factor bottle neck.

Various aspects of the disclosure provide techniques for fabrication of a series coupled, augmented capacitor structure. The process flow for semiconductor fabrication of the augmented capacitor structure may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably unless such interchanging would tax credulity.

As described herein, the back-end-of-line interconnect layers may refer to the conductive interconnect layers (e.g., metal one (M1), metal two (M2), metal three (M3), etc.) for electrically coupling to front-end-of-line active devices of an integrated circuit. The back-end-of-line interconnect layers may electrically couple to middle-of-line interconnect layers for, for example, connecting M1 to an oxide diffusion (OD) layer of an integrated circuit. A back-end-of-line first via (V2) may connect M2 to M3 or others of the back-end-of-line interconnect layers.

Aspects of the present disclosure describe a series coupled, augmented capacitor structure. In one arrangement, the augmented capacitor structure is a metal-insulator-metal (MIM) capacitor structure that includes an extended first capacitor plate. The extended first capacitor plate may be composed of a first dummy portion of a third conductive layer (e.g., M3) and a dummy via bar. In this arrangement, the dummy via bar is electrically coupled to and extends along a surface of a shared first capacitor plate of a first MIM capacitor and a second MIM capacitor, and supports the first dummy portion of the third conductive layer M3. The extended shared first capacitor plate may reduce an effective resistance of the shared first capacitor plate without involving an expensive process change. A series coupled, augmented capacitor structure including the extended first capacitor plate, although having a degraded capacitance density, may exhibit a thirty percent (30%) Q-factor improvement.

FIG. 1 illustrates a perspective view of a semiconductor wafer in an aspect of the present disclosure. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystalizes onto the seed crystal in the orientation of the crystal.

The wafer 100 may be a compound material, such as gallium arsenide (GaAs) or gallium nitride (GaN), a ternary material such as indium gallium arsenide (InGaAs), quaternary materials, or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

Once the wafer 100 has been processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form the die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
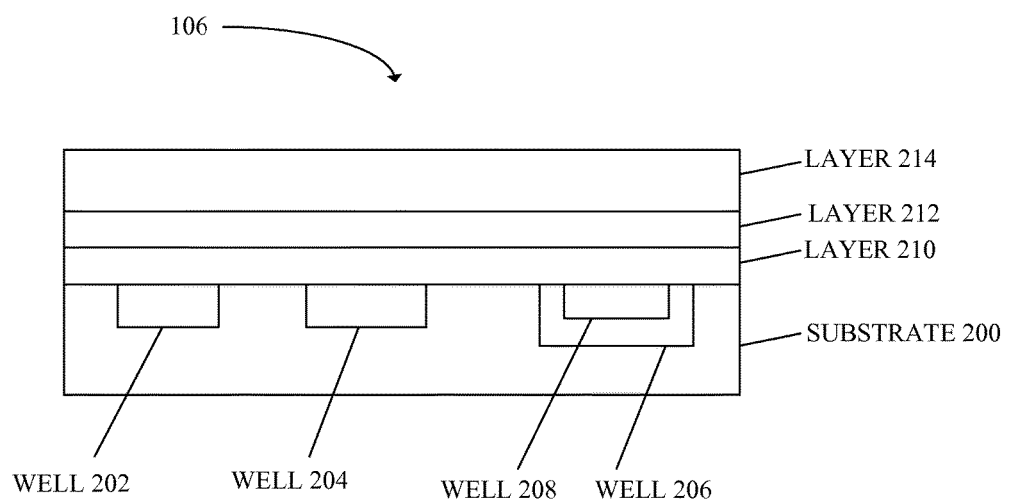
FIG. 2 illustrates a cross-sectional view of a die in accordance with an aspect of the present disclosure.

FIG. 2 illustrates a cross-sectional view of a die 106 in accordance with an aspect of the present disclosure. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200.

Within a substrate 200 (e.g., a semiconductor substrate), there may be wells 202 and 204, which may be the source and/or drain of a field-effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT). The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure.

Figure 3:
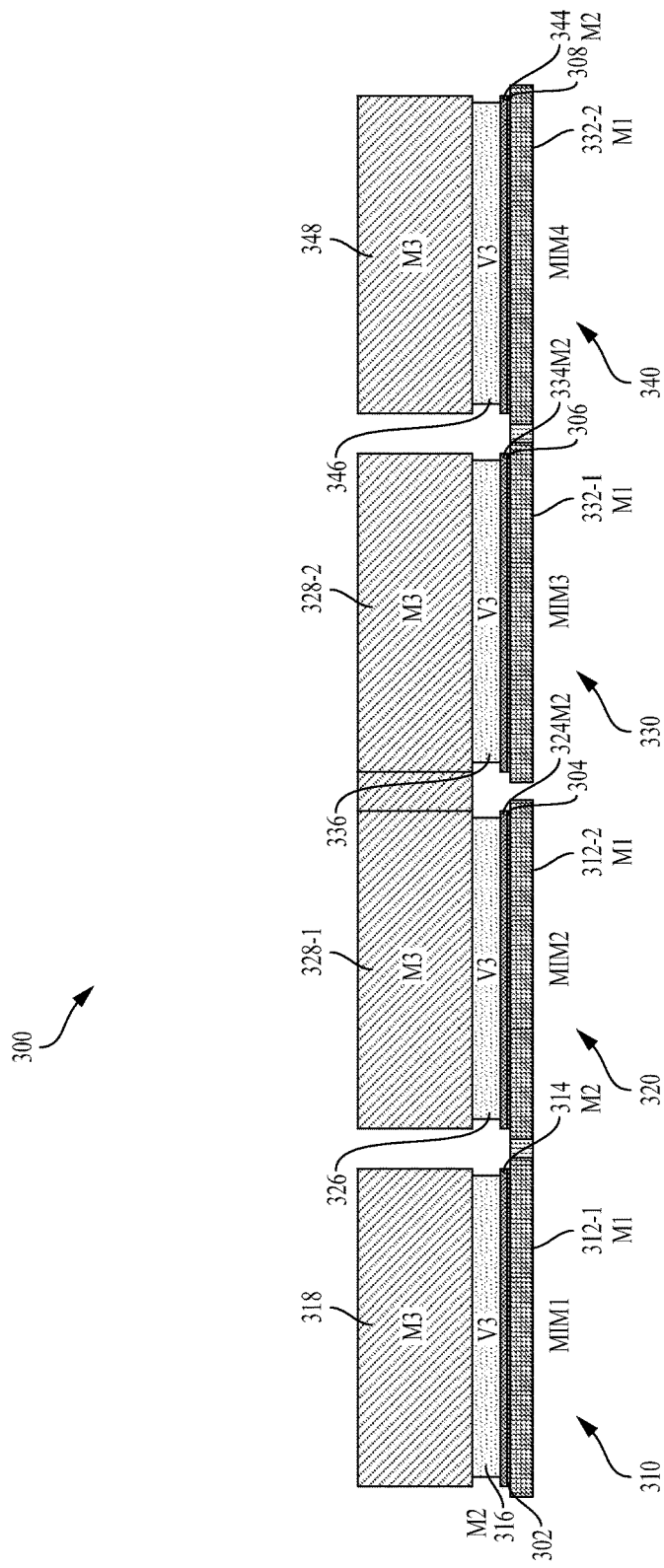
FIG. 3 illustrates a side view of a series coupled capacitor structure according to an aspect of the present disclosure.

FIG. 3 illustrates a side view of a series coupled capacitor structure 300 according to an aspect of the present disclosure. Representatively, a first metal-insulator-metal (MIM) capacitor 310 shares a first capacitor plate with a second MIM capacitor 320. The first MIM capacitor 310 includes a shared first capacitor plate 312 (312-1, 312-2) that supports a first dielectric layer 302 and a second capacitor plate 314. In this arrangement, the shared first capacitor plate 312 is formed using a first conductive layer (e.g., M1) and the second capacitor plate 314 is formed using a second conductive layer (e.g., M2). The first MIM capacitor 310 also supports a first active portion 318 of a third conductive layer (e.g., M3) through a first contact via 316 (e.g., V3). The second MIM capacitor 320 includes the shared first capacitor plate 312 that supports a second dielectric layer 304 and a second capacitor plate 324. In this arrangement, the second capacitor plate 324 is also formed using the second conductive layer M2. The second MIM capacitor 320 supports a shared active portion 328 (328-1, 328-2) of the third conductive layer M3 through a second contact via 326.

A third MIM capacitor 330 includes a shared first capacitor plate 332 (332-1, 332-2) that supports a third dielectric layer 306 and a second capacitor plate 334. In this arrangement, the second capacitor plate 334 is also formed using the second conductive layer M2. The third MIM capacitor 330 supports the shared active portion 328 of the third conductive layer M3 through a third contact via 336. In addition, a fourth MIM capacitor 340 includes the shared first capacitor plate 332 that supports a fourth dielectric layer 308 and a second capacitor plate 344. In this arrangement, the second capacitor plate 344 is also formed using the second conductive layer M2. The fourth MIM capacitor 340 also supports a second active portion 348 of the third conductive layer M3 through a fourth contact via 346.

As shown in FIG. 3, a thickness (e.g., 1-5 microns) of the shared first capacitor plate 312 is less than a thickness (e.g., 5-20 microns) of the second capacitor plate 314 of the first MIM capacitor 310 to ensure dielectric integrity. Unfortunately, a surface of the shared first capacitor plate 312 can become highly irregular if the thickness of the shared first capacitor plate 312 grows too large. In this scenario, a breakdown voltage of the first MIM capacitor 310 is reduced, resulting in increased variation of the dielectric integrity. In this arrangement, the shared first capacitor plate 312 has a substantially greater resistance than the second capacitor plate 314 of the first MIM capacitor 310. The increased resistance of the shared first capacitor plate 312, however, results in an RF quality (Q)-factor bottle neck.

Figure 4A:
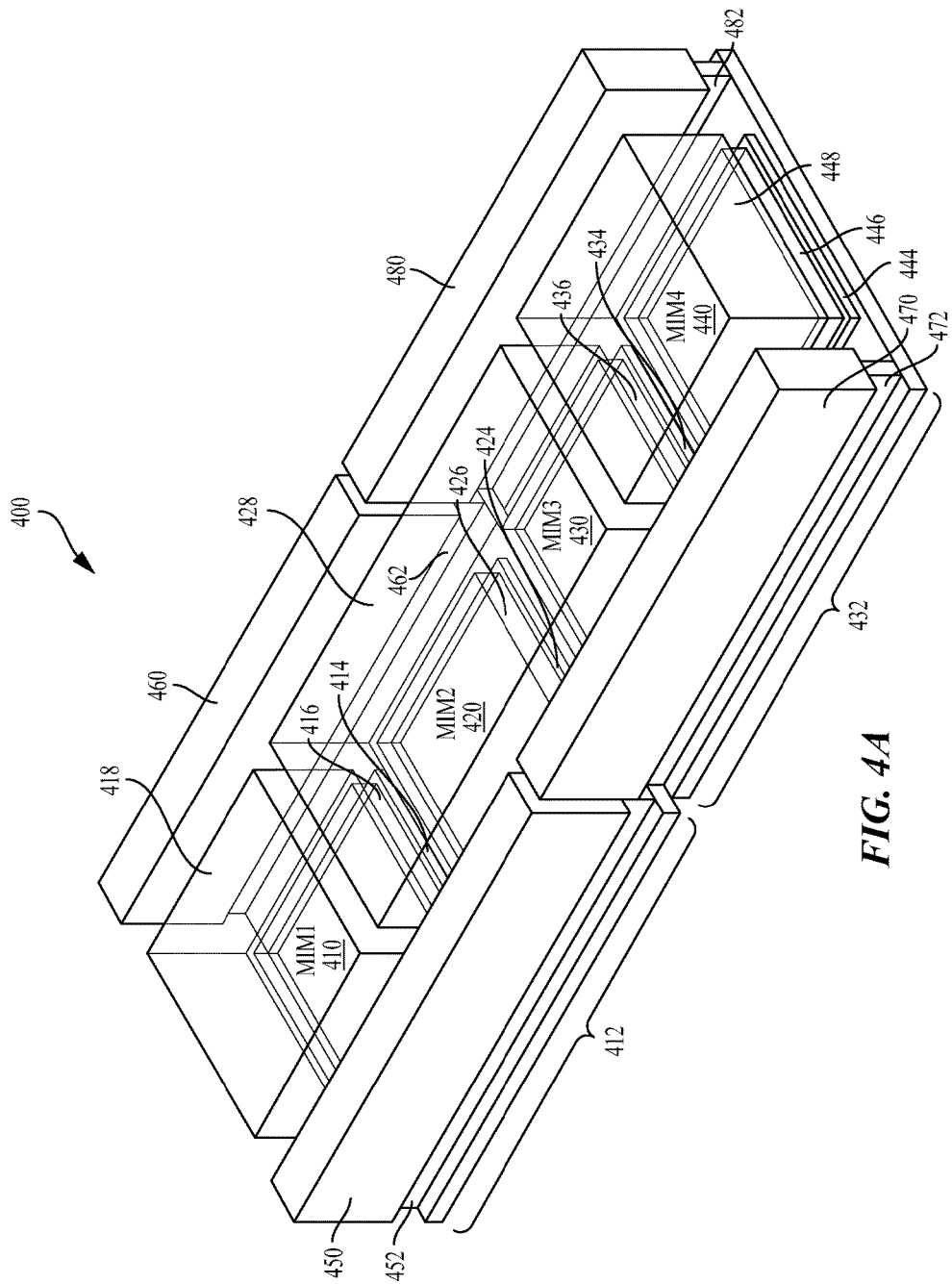
FIGS. 4A to 4D illustrates views of series coupled augmented capacitor structures according to aspects of the present disclosure.

FIG. 4A illustrates a perspective view of a series coupled augmented capacitor structure 400 according to aspects of the present disclosure. In this arrangement, the first MIM capacitor 410, the second MIM capacitor 420, the third MIM capacitor 430 and the fourth MIM capacitor 440 may be arranged as shown in FIG. 3. For example, the first MIM capacitor 410 and the second MIM capacitor 420 include a shared first capacitor plate 412. Similarly, the third MIM capacitor 430 and the fourth MIM capacitor 440 include a shared first capacitor plate 432. The first MIM capacitor 410 supports a first active portion 418 of the third conductive layer M3. The second MIM capacitor 420 is electrically coupled to the third MIM capacitor 430 through a shared active portion 428 of the third conductive layer M3. In addition, the fourth MIM capacitor 440 includes a shared first capacitor plate 432 and supports a second capacitor plate 444. The fourth MIM capacitor 440 also supports a second active portion 448 of the third conductive layer M3 through a fourth via 446.

In this aspect of the present disclosure, an extended first capacitor plate of the first MIM capacitor 410 and the second MIM capacitor 420 includes a first dummy portion 450 of the third conductive layer M3 supported by a first dummy via bar 452. The first dummy via bar 452 may extend along a surface of the shared first capacitor plate 412. In addition, the first dummy portion 450 of the third conductive layer M3 is coupled to the shared first capacitor plate 412 through the first dummy via bar 452.

In this aspect of the present disclosure, the first dummy portion 450 of the extended first capacitor plate is coplanar with and electrically isolated from a first active portion 418 of the third conductive layer M3. The first dummy portion 450 of the extended first capacitor plate is also coplanar with and electrically isolated from a shared active portion 428 of the third conductive layer M3. In addition, the first dummy via bar 452 of the extended first capacitor plate is adjacent to a second capacitor plate 414 and a first contact via 416 of the first MIM capacitor 410 as well as a second capacitor plate 424 and a second contact via 426 of the second MIM capacitor 420.

The extended first capacitor plate of the first MIM capacitor 410 and the second MIM capacitor 420 also includes a second dummy portion 460 of the third conductive layer M3 supported by a second dummy via bar 462. In this aspect of the present disclosure, the second dummy portion 460 of the extended first capacitor plate is also coplanar with and electrically isolated from the first active portion 418 of the third conductive layer M3. The second dummy portion 460 of the extended first capacitor plate is also coplanar with and electrically isolated from the shared active portion 428 of the third conductive layer M3. In addition, the second dummy via bar 462 of the extended first capacitor plate is also adjacent to the second capacitor plate 414 and the first contact via 416 of the first MIM capacitor 410 as well as the second capacitor plate 424 and the second contact via 426 of the second MIM capacitor 420.

As further illustrated in FIG. 4A, an extended first capacitor plate of the third MIM capacitor 430 and the fourth MIM capacitor 440 includes a third dummy portion 470 of the third conductive layer M3 supported by a third dummy via bar 472. The third dummy via bar 472 may extend along a surface of a shared first capacitor plate 432 of the third MIM capacitor 430 and the fourth MIM capacitor 440. In addition, the third dummy portion 470 of the third conductive layer M3 is coupled to the shared first capacitor plate 432 through the third dummy via bar 472.

In this aspect of the present disclosure, the third dummy portion 470 of the extended first capacitor plate is coplanar with and electrically isolated from a second active portion 448 of the third conductive layer M3. The third dummy portion 470 of the extended first capacitor plate is also coplanar with and electrically isolated from the shared active portion 428 of the third conductive layer M3. In addition, the third dummy via bar 472 of the extended first capacitor plate is adjacent to a second capacitor plate 434 and a third contact via 436 of the third MIM capacitor 430 as well as a second capacitor plate 444 and a fourth contact via 446 of the fourth MIM capacitor 440.

The extended first capacitor plate of the third MIM capacitor 430 and the fourth MIM capacitor 440 also includes a fourth dummy portion 480 of the third conductive layer M3 supported by a fourth dummy via bar 482. In this aspect of the present disclosure, the fourth dummy portion 480 of the extended first capacitor plate is also coplanar with and electrically isolated from the second active portion 448 of the third conductive layer M3. The fourth dummy portion 480 of the extended first capacitor plate is also coplanar with and electrically isolated from the shared active portion 428 of the third conductive layer M3. In addition, the fourth dummy via bar 482 of the extended first capacitor plate is also adjacent to the second capacitor plate 434 and the third contact via 436 of the third MIM capacitor 430 as well as the second capacitor plate 434 and the fourth contact via 446 of the fourth MIM capacitor 440.

The series coupled augmented capacitor structure 400 including the first capacitor plate extensions exhibits a reduced effective resistance. The series coupled augmented capacitor structure 400 provides an improved performance symmetric MIM capacitor without involving an expensive process change to modify a dielectric thickness of the series coupled augmented capacitor structure 400. A series coupled augmented capacitor structure 400 including the extended first capacitor plate may exhibit a thirty percent (30%) Q-factor improvement when integrated into a mobile RF transceiver.

Figure 4B:
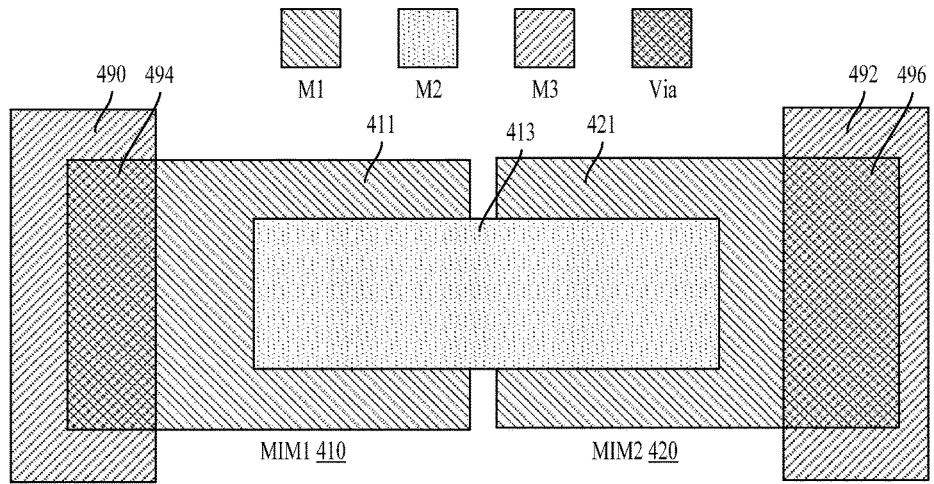
Figure 4C:
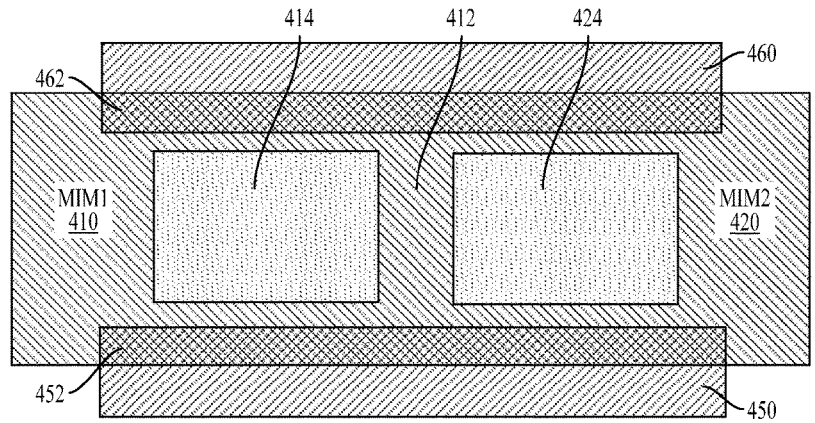
Figure 4D:
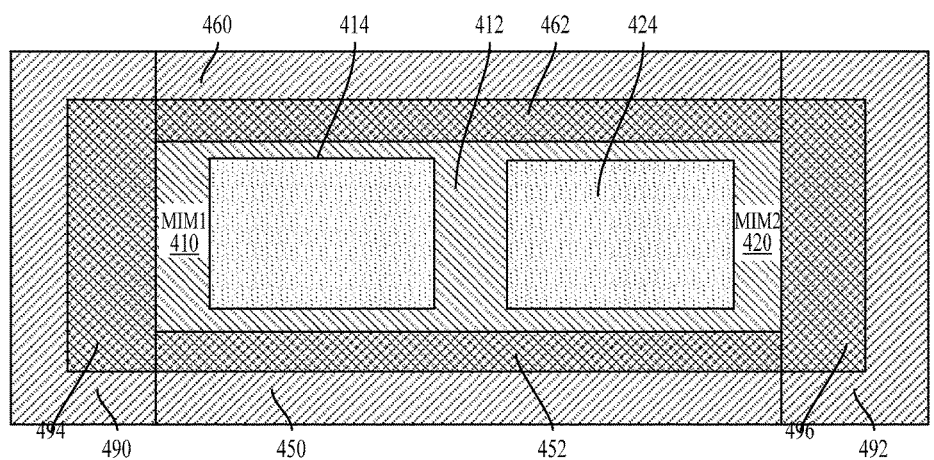

FIGS. 4B to 4D illustrate various alternative configurations of a series coupled augmented capacitor structure according to aspects of the present disclosure. As shown in FIG. 4B, a series coupled augmented capacitor structure 400 includes a first MIM capacitor 410 and a second MIM capacitor 420 that include a shared second capacitor plate 413. In this arrangement, a first capacitor plate 411 of the first MIM capacitor 410 is separate from a first capacitor pate 421 of the second MIM capacitor 420. In this arrangement, an extended first capacitor plate of the first MIM capacitor 410 includes a fifth dummy portion 490 of the third conductive layer M3 supported by a fifth dummy via bar 494. An extended first capacitor plate of the second MIM capacitor 420 includes a sixth dummy portion 492 of the third conductive layer M3 supported by a sixth dummy via bar 496 opposite the extended first capacitor plate of the first MIM capacitor 410.

The arrangement of the series coupled augmented capacitor structure 400 shown in FIG. 4C, is similar to the arrangement shown in FIG. 4A. In the arrangement of FIG. 4C, however, the third MIM capacitor 430 and the fourth MIM capacitor 440 are omitted. The arrangement of the series coupled augmented capacitor structure 400 shown in FIG. 4D, is similar to the arrangement shown in FIG. 4C. The arrangement of the series coupled augmented capacitor structure 400 shown in FIG. 4D includes the first capacitor plate extension shown in both FIGS. 4B and 4C. Representatively, the first capacitor plate extensions surround the first MIM capacitor 410 and the second MIM capacitor 420.

Although shown in the various arrangements of FIGS. 4A to 4D, it should be recognized that the series coupled augmented capacitor structure 400 is not limited to these arrangements. Furthermore, in contrast to the constantly decreasing process nodes, the series coupled augmented capacitor structure 400 may be fabricated at a larger process node. For example, the series coupled augmented capacitor structure 400 may be fabricated using a one-hundred eight (180) nanometer process node. As a result, the penalty from the reduced capacitance density of the series coupled augmented capacitor structure 400 is negligible and, therefore, is sacrificed in favor of improved linearity.

Figure 5A:
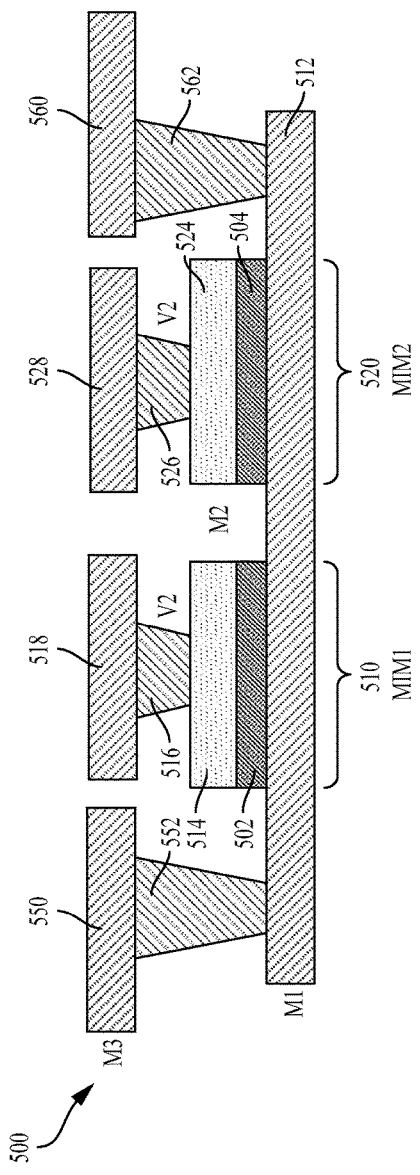
FIGS. 5A and 5B show views of a series coupled augmented capacitor structure according to aspects of the present disclosure.
Figure 5B:
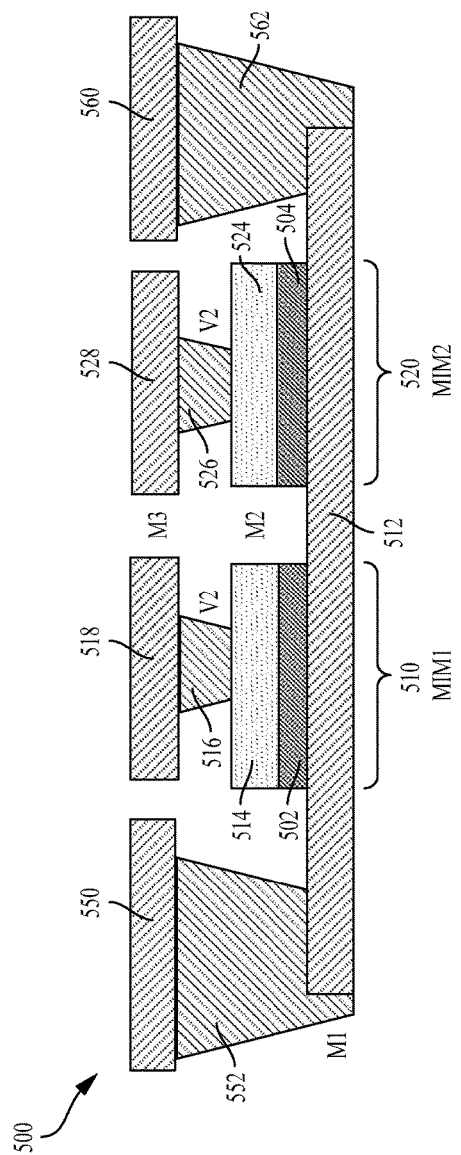

FIGS. 5A and 5B show views of a series coupled augmented capacitor structure 500 according to aspects of the present disclosure. Although shown in the various arrangements of FIGS. 5A to 5B, it should be recognized that the series coupled augmented capacitor structure 500 is not limited to these arrangements. In FIG. 5A, a series coupled augmented capacitor structure 500 includes a first MIM capacitor 510 and a second MIM capacitor 520 that share a first capacitor plate. The shared first capacitor plate 512 supports a first dielectric layer 502 and a second capacitor plate 514 of the first MIM capacitor 510. The shared first capacitor plate 512 also supports a second dielectric layer 504 and a second capacitor plate 524 of the second MIM capacitor 520. A first active portion 518 of the third conductive layer M3 is coupled to the first MIM capacitor 510 through a first contact via 516 (e.g., V2). In addition, a second active portion 528 of the third conductive layer M3 is coupled to the second MIM capacitor 520 through a second contact via 526.

As illustrated in FIG. 5A, an extended first capacitor plate of the first MIM capacitor 510 includes a first dummy portion 550 of the third conductive layer M3 supported by a first dummy via bar 552. The first dummy via bar 552 may extend along a surface of the shared first capacitor plate 512 adjacent to the first dielectric layer 502, the second capacitor plate 514 and the first contact via 516. In addition, the first dummy portion 550 of the third conductive layer M3 is coupled to the shared first capacitor plate 512 through the first dummy via bar 552. The first dummy portion 550 of the extended first capacitor plate is also coplanar with and electrically isolated from the first active portion 518 of the third conductive layer M3.

As further illustrated in FIG. 5A, an extended first capacitor plate of the second MIM capacitor 520 includes a second dummy portion 560 of the third conductive layer M3 supported by a second dummy via bar 562. In this arrangement, the extended first capacitor plate of the second MIM capacitor 520 is disposed on a portion of the shared first capacitor plate 512 opposite from the extended first capacitor plate of the first MIM capacitor 510. The second dummy via bar 562 may extend along a surface of the shared first capacitor plate 512 adjacent to the second dielectric layer 504, the second capacitor plate 524 and the second contact via 526. In addition, the second dummy portion 560 of the third conductive layer M3 is coupled to the shared first capacitor plate 512 through the second dummy via bar 552. The second dummy portion 560 of the extended first capacitor plate of the second MIM capacitor 520 is coplanar with and electrically isolated from the second active portion 528 of the third conductive layer M3.

FIG. 5B illustrates a series coupled augmented capacitor structure 500 according to further aspects of the present disclosure. In this arrangement, the first MIM capacitor 510 and the second MIM capacitor 520 are arranged to include the shared first capacitor plate 512, as shown in FIG. 5A. In addition, the first active portion 518, the first active via 516, the second active portion 528 and the second active via 516 are also arranged as shown in FIG. 5A. The first dummy portion 550 and the second dummy portion 560 of the third conductive layer M3 are also arranged as shown in FIG. 5A as coplanar with and electrically isolated from the first active portion 518 and the second active portion 528 of the third conductive layer M3. In this aspect of the disclosure, however, the first dummy via bar 552 is expanded to extend along a sidewall of the shared first capacitor plate 512. In addition, the second dummy via bar 562 is also expanded to extend along a sidewall of the shared first capacitor plate 512 opposite the first dummy via bar 552. A bottom surface of the first dummy via bar 552 is aligned with a bottom surface of the shared first capacitor plate 512, and a lower surface of the second dummy via bar 562 is aligned with the bottom surface of the shared first capacitor plate 512.

Figure 5C:
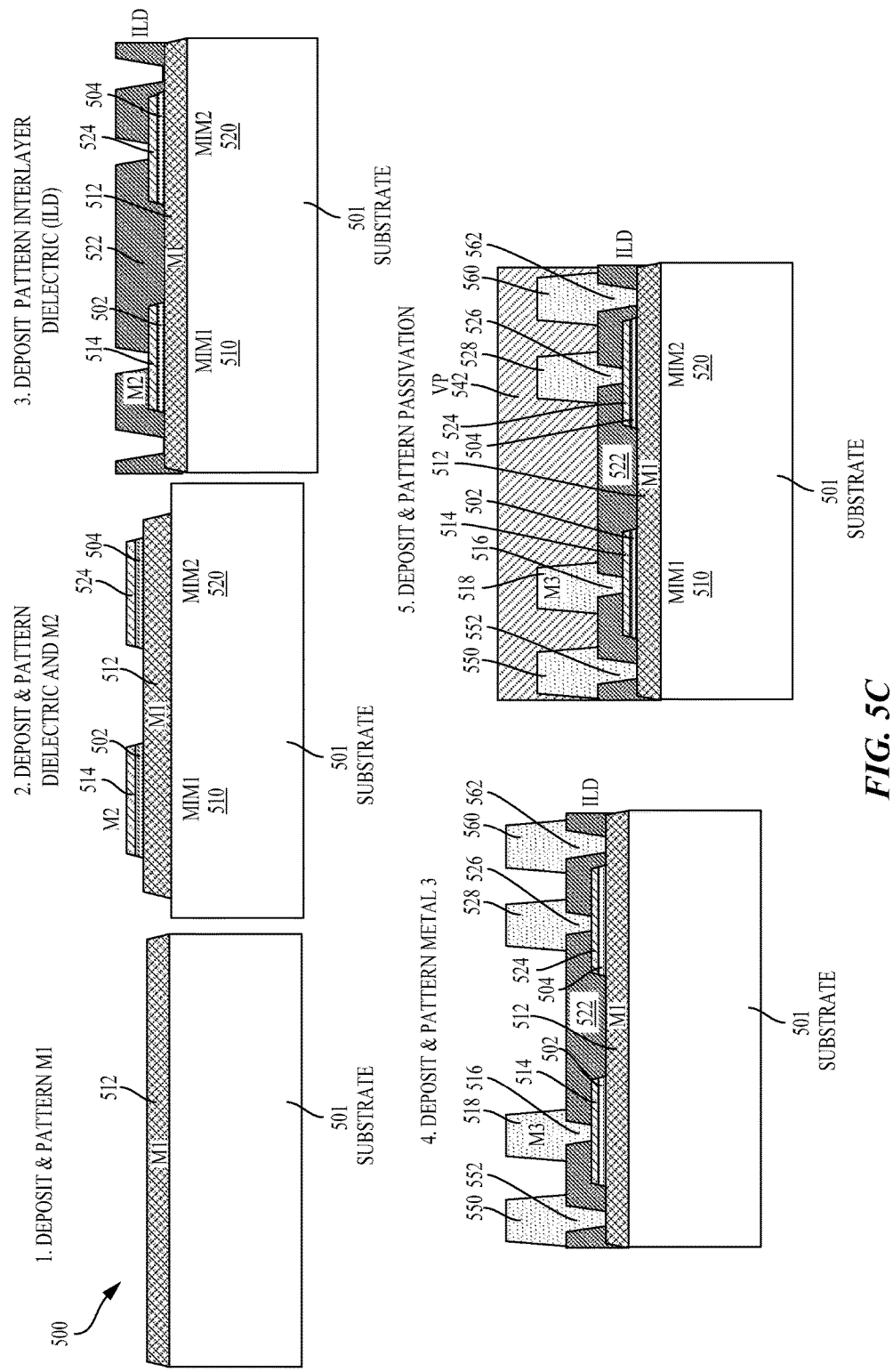
FIG. 5C is a diagram illustrating a process of fabricating a series coupled augmented capacitor structure according to aspects of the disclosure.

FIG. 5C is a diagram illustrating a process of fabricating a series coupled augmented capacitor structure according to aspects of the disclosure. At step 1, a first conductive layer (e.g., M1) is deposited on a substrate 501 (e.g., glass, quartz, silicon or other like insulator material.) The first conductive layer M1 is then patterned to provide a shared first capacitor plate 512. In this arrangement, the first conductive layer M1 provides a first capacitor plate that is shared between a first MIM capacitor 510 and a second MIM capacitor 520 as a shared first capacitor plate 512. At step 2, a first dielectric layer 502 and a second dielectric layer 504 are deposited on the shared first capacitor plate 512. In addition, a second conductive layer (e.g., M2) is deposited on the first dielectric layer 502 and the second dielectric layer 504 as a second capacitor plate 514 of the first MIM capacitor 510 and a second capacitor plate 524 of the second MIM capacitor 520. In this arrangement, the first MIM capacitor 510 is coupled in series with the second MIM capacitor 520 through the shared first capacitor plate 512.

At step 3, an interlayer dielectric 522 is deposited and patterned to expose portions of the shared first capacitor plate 512 as well as a portion of the second capacitor plate 514 of the first MIM capacitor 510 and the second capacitor plate 524 of the second MIM capacitor 520. At step 4, a third conductive layer (e.g., M3) is deposited on the interlayer dielectric (ILD) 522 and patterned. A first dummy via bar 552 is deposited on the shared first capacitor plate 512 and within an opening of the ILD 522, and a second dummy via bar 562 is deposited on the shared first capacitor plate 512 and within another opening of the ILD 522.

In this arrangement, the first contact via 518 and the second contact via 528 are also patterned and deposited within openings of the ILD 522. In addition, the third conductive layer M3 is patterned to provide a first dummy portion 550 and the second dummy portion 560 of the extended first capacitor plate. The first active portion 518 and the second active portion 528 of the third conductive layer are also deposited and patterned. At step 5, a passivation layer (VP) 542 is deposited on the ILD 522, the first dummy portion 550, the second dummy portion 560, the first active portion 518 and the second active portion 528 of the third conductive layer.

Figure 6:
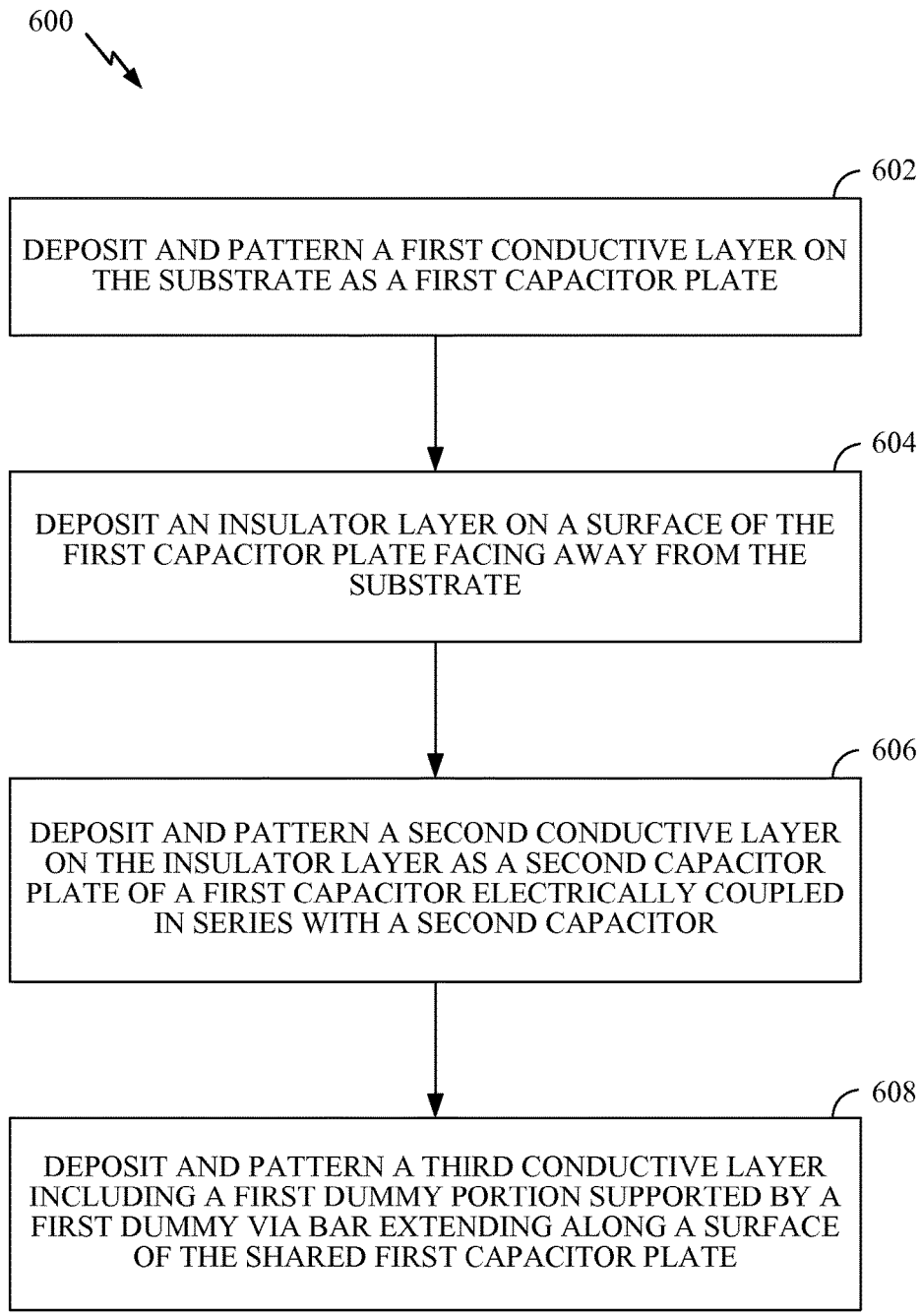
FIG. 6 is a process flow diagram illustrating a method for fabricating an augmented capacitor structure according to an aspect of the present disclosure.

FIG. 6 is a flow diagram illustrating a method 600 of fabricating an augmented capacitor structure according to aspects of the disclosure. At block 602, a first conductive layer is deposited on a substrate and patterned as a first capacitor plate. For example, as shown in FIG. 5C, a first conductive layer (e.g., M1) is deposited on a substrate 501. The first conductive layer M1 is then patterned to provide a shared first capacitor plate 512. In this arrangement, the first conductive layer M1 provides a first capacitor plate that is shared between a first MIM capacitor 510 and a second MIM capacitor 520 as a shared first capacitor plate 512.

Referring again to FIG. 6, at block 604, an insulator layer is deposited on a surface of the first capacitor plate facing away from the substrate. At block 606, a second conductive layer is deposited on the insulator layer and patterned as a second capacitor plate of a first capacitor electrically coupled in series with a second capacitor. The second conductive layer is also patterned as a second capacitor plate of the second capacitor. As shown in FIG. 5C, a first dielectric layer 502 and a second dielectric layer 504 are deposited on the shared first capacitor plate 512. In addition, a second n by reference and are intended deposited on the first dielectric layer 502 and the second dielectric layer 504 as a second capacitor plate 514 of the first MIM capacitor 510 and the second capacitor plate 524 of the second MIM capacitor 520. In this arrangement, the first MIM capacitor 510 is coupled in series with the second MIM capacitor 520 through the shared first capacitor plate 512.

Referring again to FIG. 6, at block 608, a third conductive layer is deposited and patterned to include a dummy portion supported by a dummy via bar extending along a surface of the shared first capacitor plate. For example, as shown in FIG. 5C, a third conductive layer (e.g., M3) is deposited on an interlayer dielectric (ILD) 522. In this arrangement, a first dummy via bar 552 is deposited on the shared first capacitor plate 512 and within an opening of the ILD 522. The first dummy via bar 552 is shown as extending along a sidewall of the first dielectric layer 502 and the second capacitor plate 514 of the first MIM capacitor 510. In addition, the first dummy via bar 552 may extend along a sidewall of the shared first capacitor plate 512, for example, as shown in FIG. 5B.

In one configuration, a series coupled augmented capacitor structure is described. The augmented capacitor structure includes an extended first capacitor structure. The extended first capacitor structure includes a first dummy portion of a third conductive layer and a first means for extending along the surface of the shared first capacitor plate. In one aspect of the disclosure, the first extending means is the first dummy via bar 452 of FIG. 4 or the first dummy via bar 552 of FIGS. 5A and 5B, configured to perform the functions recited by the first extending means. The augmented capacitor structure may further include an extended second capacitor structure. The extended second capacitor structure may include a second dummy portion of a third conductive layer and a second means for extending along the surface of the shared first capacitor plate. In one aspect of the disclosure, the second extending means is the second dummy via bar 462 of FIG. 4 or the second dummy via bar 562 of FIGS. 5A and 5B, configured to perform the functions recited by the second extending means. In another aspect, the aforementioned means may be a device or any layer configured to perform the functions recited by the aforementioned means.

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as carrier aggregation. Further design challenges for mobile RF transceivers include analog/RF performance considerations, including mismatch, noise and other performance considerations. The design of these mobile RF transceiver includes the use of capacitors to, for example, suppress resonance, and/or to perform filtering, bypassing and coupling.

Aspects of the present disclosure describe a series coupled, augmented capacitor structure. In one arrangement, the augmented capacitor structure is a metal-insulator-metal capacitor structure that includes an extended first capacitor plate. The extended first capacitor plate may be composed of a first dummy portion of a third conductive layer (e.g., M3) and a dummy via bar. In this arrangement, the dummy via bar is electrically coupled to and extends along a surface of a shared first capacitor plate and supports the first dummy portion of the third conductive layer M3. The extended first capacitor plate may reduce an effective resistance of the first capacitor plate without involving an expensive process change. A series coupled, augmented capacitor structure, although having a degraded capacitance density due to the extended first capacitor plate, may exhibit a thirty percent (30%) Q-factor improvement when integrated into a mobile RF transceiver.

Figure 7:
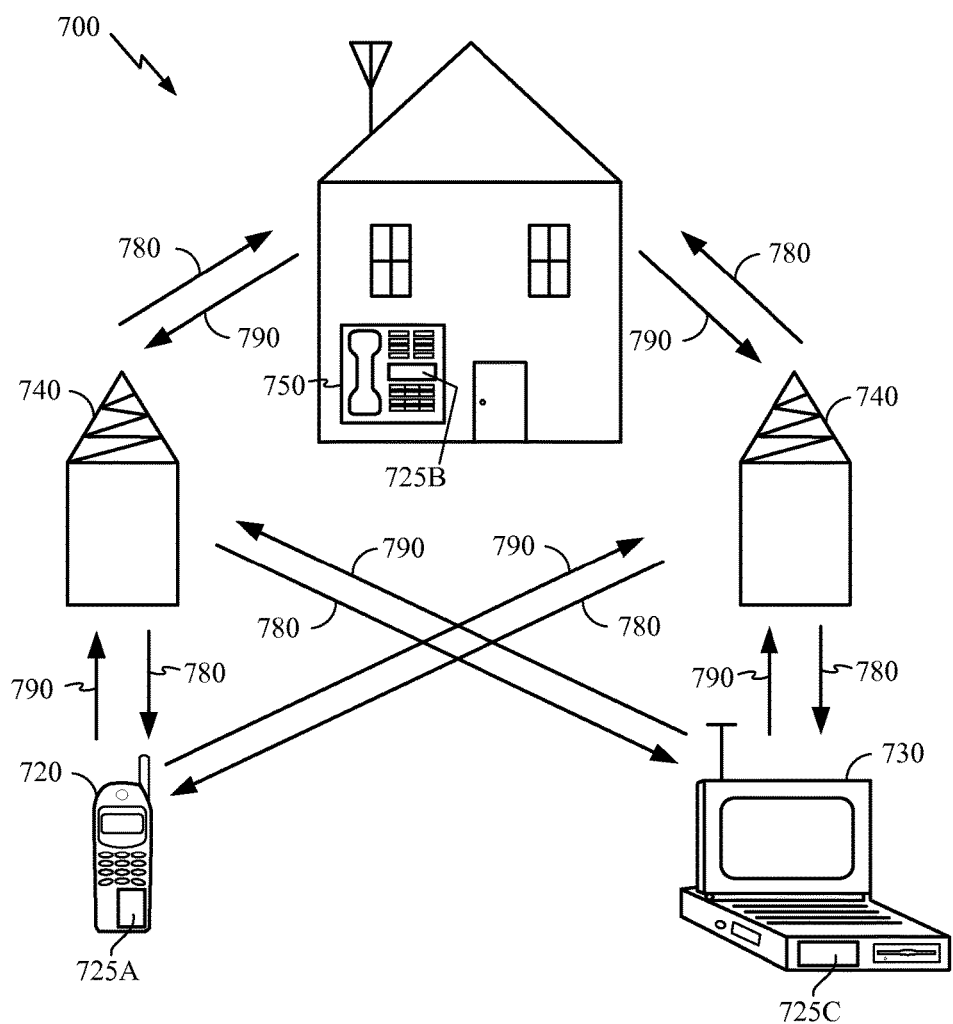
FIG. 7 is a block diagram showing an exemplary wireless communication system in which a configuration of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C, and 725B that include the disclosed augmented capacitors. It will be recognized that other devices may also include the disclosed augmented capacitors, such as the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, the remote units 720, 730, and 750 may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or a communications device that store or retrieve data or computer instructions, or combinations thereof. Although FIG. 7 illustrates remote units according to the aspects of the disclosure, the disclosure is not limited to these exemplary illustrated units. Aspects of the disclosure may be suitably employed in many devices, which include the disclosed devices.

Figure 8:
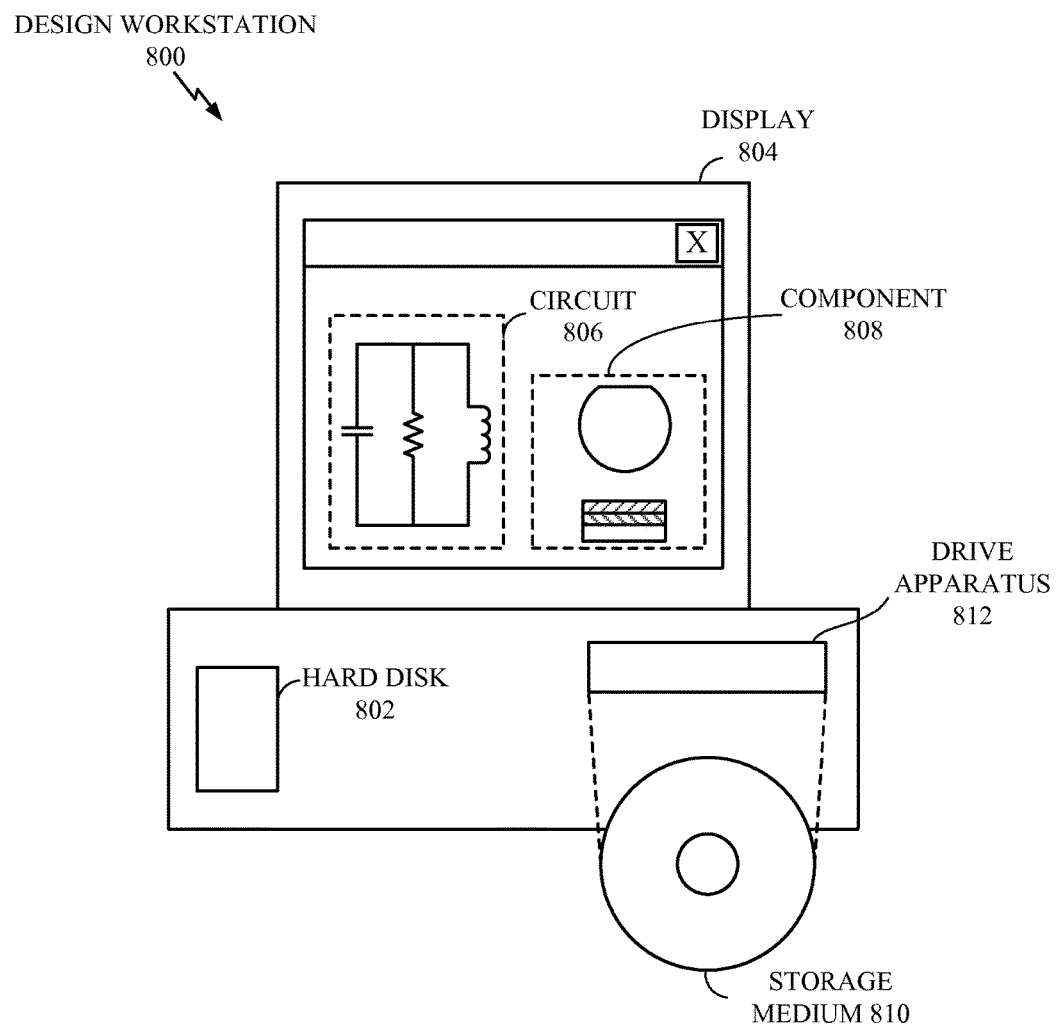
FIG. 8 is a block diagram illustrating a design workstation used for circuit, layout, and logic design of a semiconductor component according to one configuration.

FIG. 8 is a block diagram illustrating a design workstation used for circuit, layout, and logic design of a semiconductor component, such as the augmented capacitors disclosed above. A design workstation 800 includes a hard disk 802 containing operating system software, support files, and design software such as Cadence or OrCAD. The design workstation 800 also includes a display 804 to facilitate design of a circuit 806 or a semiconductor component 808 such as an augmented capacitor. A storage medium 810 is provided for tangibly storing the design of the circuit 806 or the semiconductor component 808. The design of the circuit 806 or the semiconductor component 808 may be stored on the storage medium 810 in a file format such as GDSII or GERBER. The storage medium 810 may be a CD-ROM, DVD, hard disk, flash memory, or other appropriate device. Furthermore, the design workstation 800 includes a drive apparatus 812 for accepting input from or writing output to the storage medium 810.

Data recorded on the storage medium 810 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 810 facilitates the design of the circuit 806 or the semiconductor component 808 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. An augmented capacitor structure, comprising:
   a substrate;
   a first capacitor plate, comprising a first conductive layer on the substrate;
   an insulator layer on a surface of the first capacitor plate facing away from the substrate;
   a second capacitor plate, comprising a second conductive layer on the insulator layer and supported by the first capacitor plate as a first capacitor;
   a second capacitor electrically coupled in series with the first capacitor, in which the first capacitor plate is shared by the first capacitor and the second capacitor as a shared first capacitor plate;
   an extended first capacitor structure, comprising a first dummy portion of a third conductive layer and a first dummy via bar, the first dummy via bar directly on at least a first sidewall of the shared first capacitor plate and extending directly along a first surface of the shared first capacitor plate facing the second capacitor plate, the first dummy portion extending along and supported by the first dummy via bar, in which a bottom surface of the first dummy via bar is aligned with a second surface opposite the first surface of the shared first capacitor plate; and
   an extended second capacitor structure comprising a second dummy portion of the third conductive layer and a second dummy via bar, the second dummy via bar directly on at least a second sidewall opposite the first sidewall of the shared first capacitor plate and extending directly along the first surface of the shared first capacitor plate, the second dummy portion extending along and supported by the second dummy via bar, in which a bottom surface of the second dummy via bar is aligned with the second surface of the shared first capacitor plate.

2. The augmented capacitor structure of claim 1, further comprising a third capacitor electrically coupled in series with the second capacitor through a shared active portion of the third conductive layer, in which the first capacitor plate of the third capacitor is separate from the first capacitor plate of the second capacitor.

3. The augmented capacitor structure of claim 2, further comprising a fourth capacitor electrically coupled in series with the third capacitor, in which the fourth capacitor and the third capacitor share the first capacitor plate of the third capacitor.

4. The augmented capacitor structure of claim 1, further comprising an active portion of the third conductive layer coupled to the second capacitor plate through a contact via, in which the first dummy portion of the extended first capacitor structure is coplanar with and electrically isolated from the active portion of the third conductive layer.

5. The augmented capacitor structure of claim 1, further comprising an active portion of the third conductive layer coupled to the second capacitor plate through a first contact via, in which the first dummy via bar of the extended first capacitor structure is adjacent to the second capacitor plate and the first contact via.

6. The augmented capacitor structure of claim 1, in which the substrate comprises glass, quartz, or silicon.

7. The augmented capacitor structure of claim 1, incorporated into at least one of a music player, a video player, an entertainment unit, a navigation device, a communications device, a personal digital assistant (PDA), a fixed location data unit, and a computer.

8. A method of fabricating an augmented capacitor structure, comprising:
   depositing and patterning a first conductive layer on a substrate as a first capacitor plate;
   depositing an insulator layer on a surface of the first capacitor plate facing away from the substrate;
   depositing and patterning a second conductive layer on the insulator layer as a second capacitor plate of a first capacitor electrically coupled in series with a second capacitor, in which the first capacitor plate is shared by the first capacitor and the second capacitor as a shared first capacitor plate;
   depositing and patterning a third conductive layer as an extended first capacitor structure, including a first dummy portion supported by a first dummy via bar, the first dummy via bar directly on at least a first sidewall of the shared first capacitor plate and extending directly along a first surface of the shared first capacitor plate, the first dummy portion extending along the first dummy via bar, in which a bottom surface of the first dummy via bar is aligned with a second surface opposite the first surface of the shared first capacitor plate; and
   depositing and patterning the third conductive layer as an extended second capacitor structure, including a second dummy portion supported by a second dummy via bar, the second dummy via bar directly on at least a second sidewall opposite the first sidewall of the shared first capacitor plate and extending directly along the first surface of the shared first capacitor plate, the second dummy portion extending along the second dummy via bar, in which a bottom surface of the second dummy via bar is aligned with the second surface of the shared first capacitor plate.

9. The method of claim 8, further comprising depositing and patterning a passivation layer on an interlayer dielectric.

10. The method of claim 8, further comprising incorporating the augmented capacitor structure into at least one of a music player, a video player, an entertainment unit, a navigation device, a communications device, a personal digital assistant (PDA), a fixed location data unit, and a computer.

11. An augmented capacitor structure, comprising:
   a substrate;
   a first capacitor plate, comprising a first conductive layer on the substrate;
   an insulator layer on a surface of the first capacitor plate facing away from the substrate;
   a second capacitor plate, comprising a second conductive layer on the insulator layer and supported by the first capacitor plate as a first capacitor;
   a second capacitor electrically coupled in series with the first capacitor, in which the first capacitor plate is shared by the first capacitor and the second capacitor as a shared first capacitor plate;
   an extended first capacitor structure, comprising a first dummy portion of a third conductive layer and a first means for extending directly along a first surface of the shared first capacitor plate facing the second capacitor plate and disposed directly on at least a first sidewall of the shared first capacitor plate, the first dummy portion extending along and supported by the first extending means, in which a bottom surface of the first extending means is aligned with a second surface opposite the first surface of the shared first capacitor plate; and
   an extended second capacitor structure, comprising a second dummy portion of the third conductive layer and a second means for extending directly along the first surface of the shared first capacitor plate and disposed directly on at least a second sidewall opposite the first sidewall of the shared first capacitor plate, the second dummy portion extending along and supported by the second extending means, in which a bottom surface of the second extending means is aligned with the second surface of the shared first capacitor plate.

12. The augmented capacitor structure of claim 11, further comprising a third capacitor electrically coupled in series with the second capacitor through a shared active portion of the third conductive layer, in which the first capacitor plate of the third capacitor is separate from the first capacitor plate of the second capacitor.

13. The augmented capacitor structure of claim 12, further comprising a fourth capacitor electrically coupled in series with the third capacitor, in which the fourth capacitor and the third capacitor share the first capacitor plate of the third capacitor.

14. The augmented capacitor structure of claim 11, further comprising an active portion of the third conductive layer coupled to the second capacitor plate through a contact via, in which the first dummy portion of the extended first capacitor structure is coplanar with and electrically isolated from the active portion of the third conductive layer.

15. The augmented capacitor structure of claim 11, further comprising an active portion of the third conductive layer coupled to the second capacitor plate through a first contact via, in which the first extending means is adjacent to the second capacitor plate and the first contact via.

16. The augmented capacitor structure of claim 11, in which the substrate comprises glass, quartz, or silicon.

17. The augmented capacitor structure of claim 11, incorporated into at least one of a music player, a video player, an entertainment unit, a navigation device, a communications device, a personal digital assistant (PDA), a fixed location data unit, and a computer.

18. A method of fabricating an augmented capacitor structure, comprising:
   a step for depositing and patterning a first conductive layer on a substrate as a first capacitor plate;
   a step for depositing an insulator layer on a surface of the first capacitor plate facing away from the substrate;
   a step for depositing and patterning a second conductive layer on the insulator layer as a second capacitor plate of a first capacitor electrically coupled in series with a second capacitor, in which the first capacitor plate is shared by the first capacitor and the second capacitor as a shared first capacitor plate;
   a step for depositing and patterning a third conductive layer as an extended first capacitor structure, including a first dummy portion supported by a first dummy via bar, the first dummy via bar directly on at least a first sidewall of the shared first capacitor plate and extending directly along a first surface of the shared first capacitor plate, the first dummy portion extending along the first dummy via bar, in which a bottom surface of the first dummy via bar is aligned with a second surface opposite the first surface of the shared first capacitor plate; and a step for depositing and patterning the third conductive layer as an extended second capacitor structure, including a second dummy portion supported by a second dummy via bar, the second dummy via bar directly on at least a second sidewall opposite the first sidewall of the shared first capacitor plate and extending directly along the first surface of the shared first capacitor plate, the second dummy portion extending along the second dummy via bar, in which a bottom surface of the second dummy via bar is aligned with the second surface of the shared first capacitor plate.

19. The method of claim 18, further comprising a step for depositing and patterning a passivation layer on an interlayer dielectric.

20. The method of claim 18, further comprising a step for incorporating the augmented capacitor structure into at least one of a music player, a video player, an entertainment unit, a navigation device, a communications device, a personal digital assistant (PDA), a fixed location data unit, and a computer.

* * * * *